(12) United States Patent
Kikuchi et al.

(10) Patent No.: US 8,059,369 B2
(45) Date of Patent: Nov. 15, 2011

(54) HEAD GIMBAL ASSEMBLY AND DISK DRIVE PROVIDED WITH THE SAME

(75) Inventors: Takafumi Kikuchi, Akiruno (JP); Yasutaka Sasaki, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 12/693,340

(22) Filed: Jan. 25, 2010

(65) Prior Publication Data

US 2010/0296195 A1 Nov. 25, 2010

(30) Foreign Application Priority Data

May 22, 2009 (JP) ................................. 2009-124418

(51) Int. Cl.
*G11B 5/60* (2006.01)
(52) U.S. Cl. ..................................................... 360/264.3
(58) Field of Classification Search ................ 360/264.3
See application file for complete search history.

(56) References Cited

U.S. PATENT DOCUMENTS

| | | | |
|---|---|---|---|
| 6,891,700 B2* | 5/2005 | Shiraishi et al. | 360/245.9 |
| 6,963,471 B2* | 11/2005 | Arai et al. | 360/246 |
| 6,965,501 B1* | 11/2005 | Pan et al. | 360/245.7 |
| 7,051,423 B2* | 5/2006 | Gouo | 29/603.03 |
| 7,110,222 B2* | 9/2006 | Erpelding | 360/264.2 |
| 7,248,444 B1* | 7/2007 | Lauer | 360/294.4 |

FOREIGN PATENT DOCUMENTS

| | | |
|---|---|---|
| JP | 4028477 B2 | 6/2005 |
| JP | 2006-049751 A | 2/2006 |
| JP | 2007-234982 | 9/2007 |
| JP | 2007-537562 A | 12/2007 |
| JP | 2008-198738 A | 8/2008 |
| WO | WO 2005/114658 A2 | 12/2005 |

OTHER PUBLICATIONS

Explanation of Non-English Language References, Dec. 1, 2005.

* cited by examiner

*Primary Examiner* — Mark Blouin
(74) *Attorney, Agent, or Firm* — Knobbe, Martens, Olson & Bear, LLP

(57) ABSTRACT

According to one embodiment, a head gimbal assembly of a disk drive includes an arm and a suspension extending from the arm, a head supported by the suspension, and a flexure on the arm and the suspension. One end portion of the flexure is electrically connected to the head, and the other end portion thereof includes a terminal area. The flexure includes a base insulating layer, a conductor pattern formed on the base insulating layer and having a plurality of connection terminals, and a cover insulating layer formed on the base insulating layer so as to cover the conductor pattern. The connection terminals are exposed to the inside of an opening in the base and cover insulating layers with a protective insulating layer and a thin metal plate overlaid on one surface of each of the connection terminals.

14 Claims, 8 Drawing Sheets

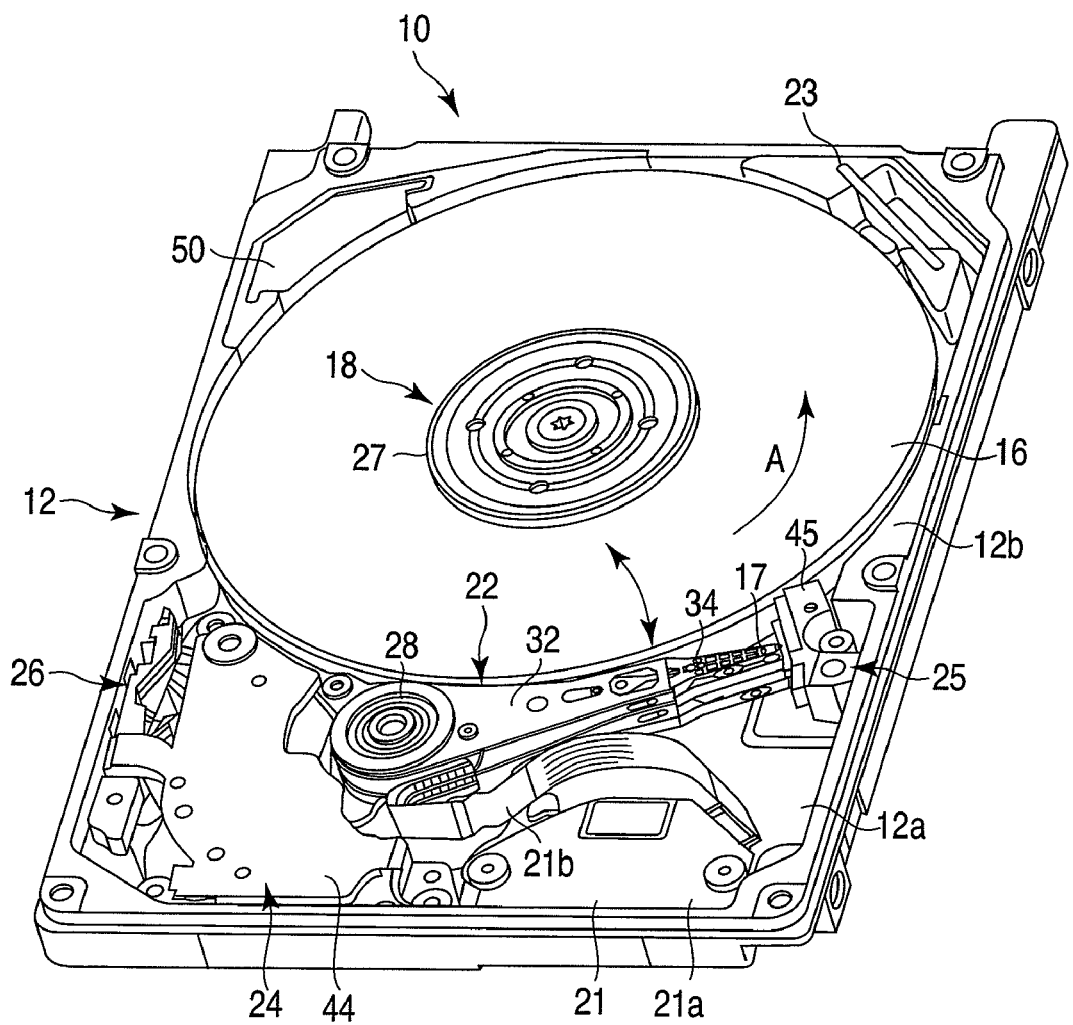
F I G. 1

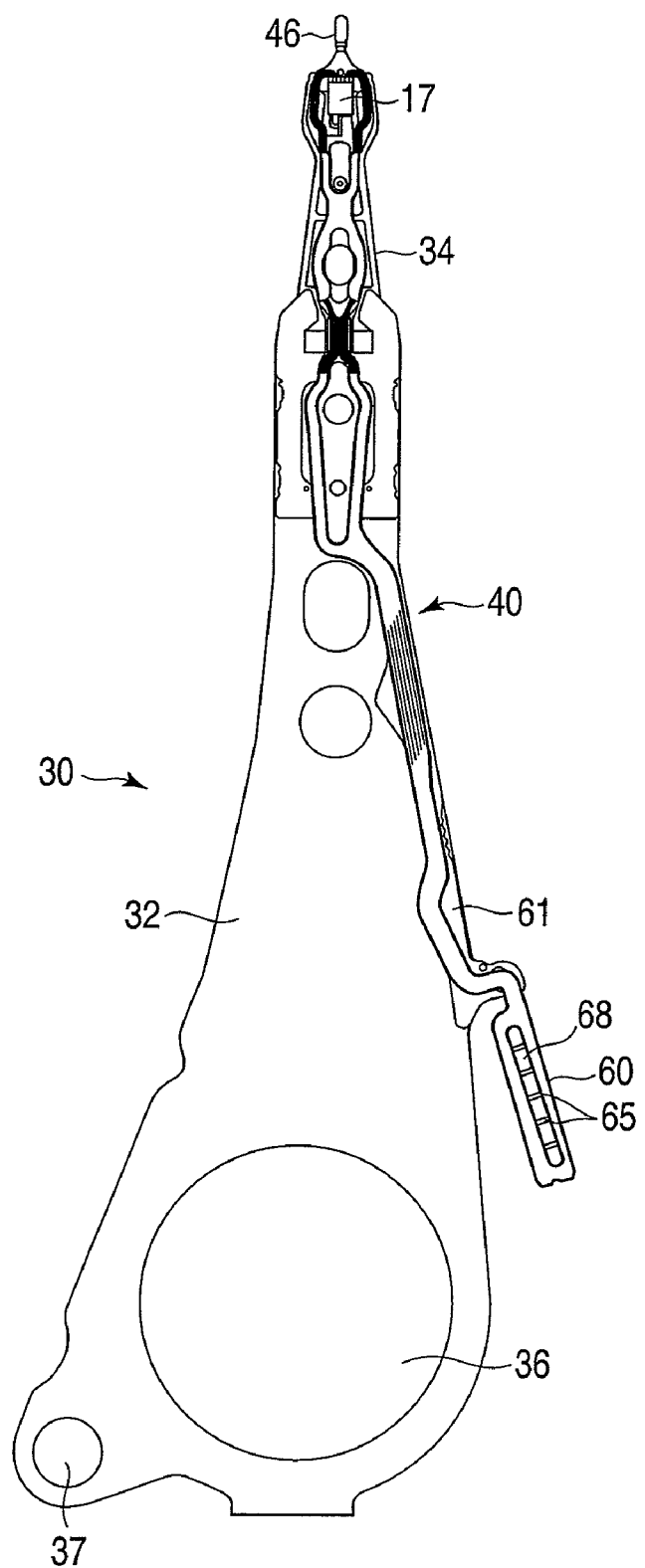
F I G. 3

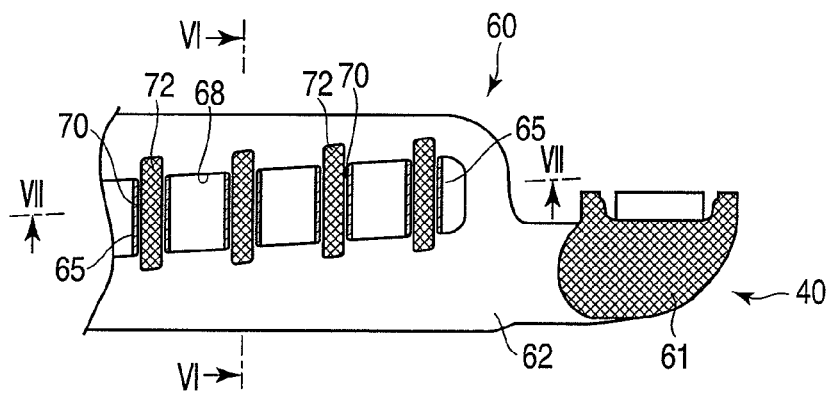
F I G. 5A
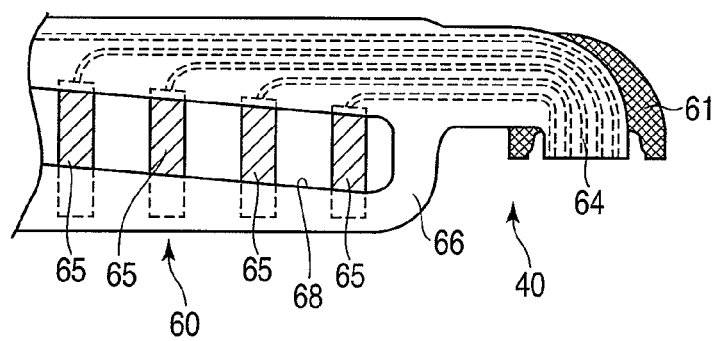
F I G. 5B
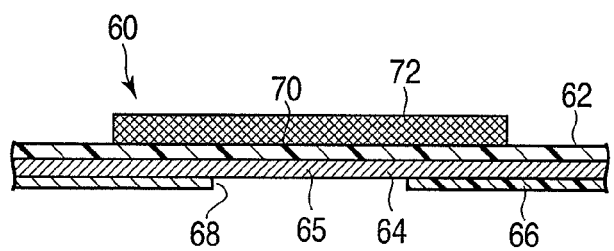
F I G. 6
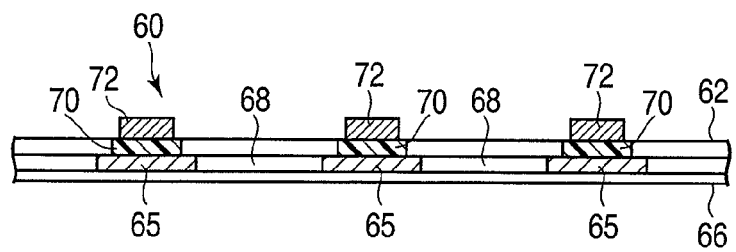
F I G. 7

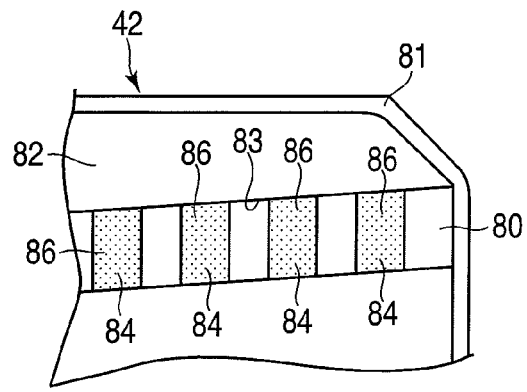
F I G. 8
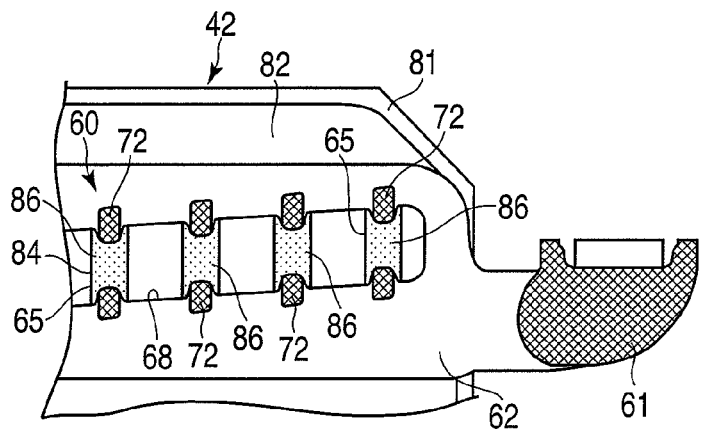
F I G. 9
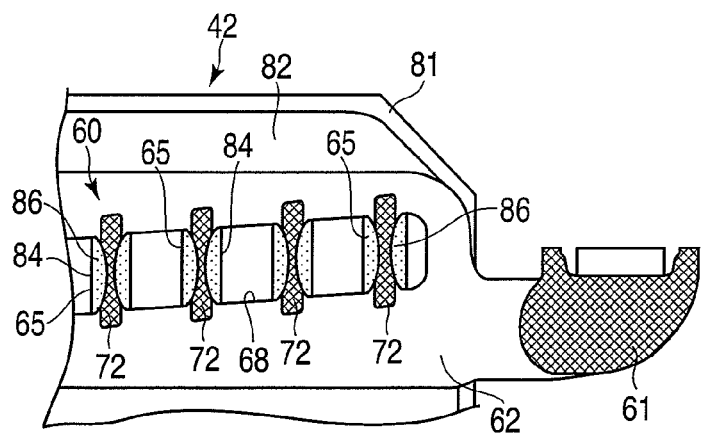
F I G. 10

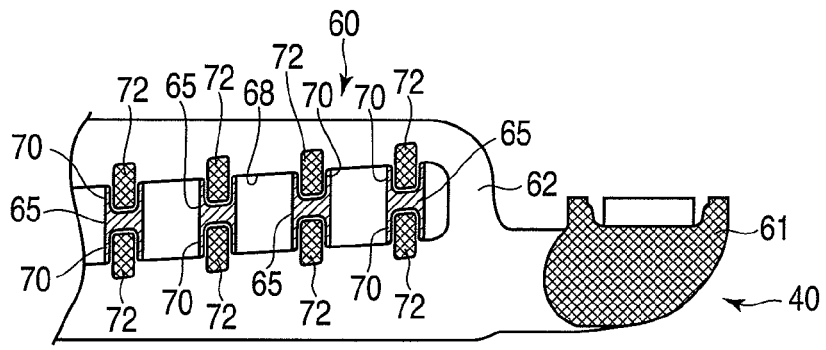
FIG. 11A
FIG. 11B
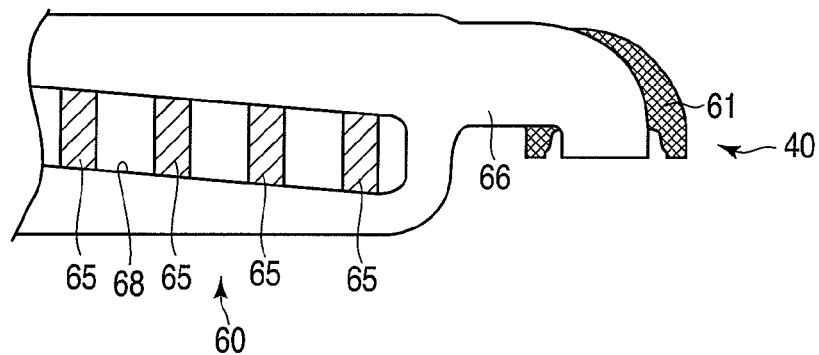
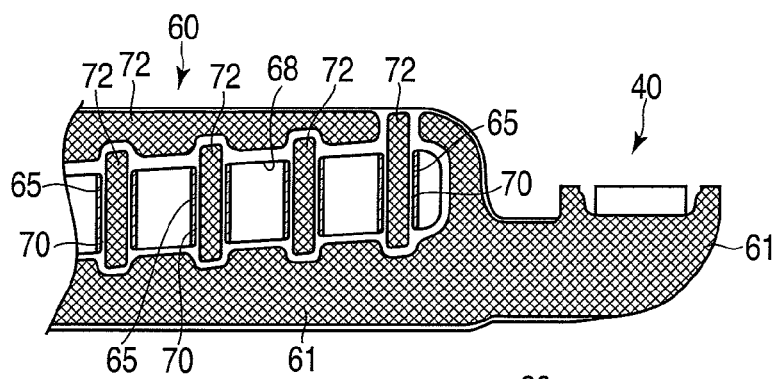
FIG. 12A
FIG. 12B
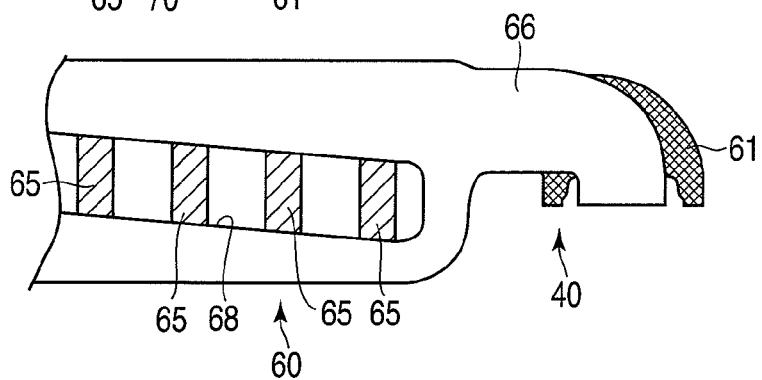

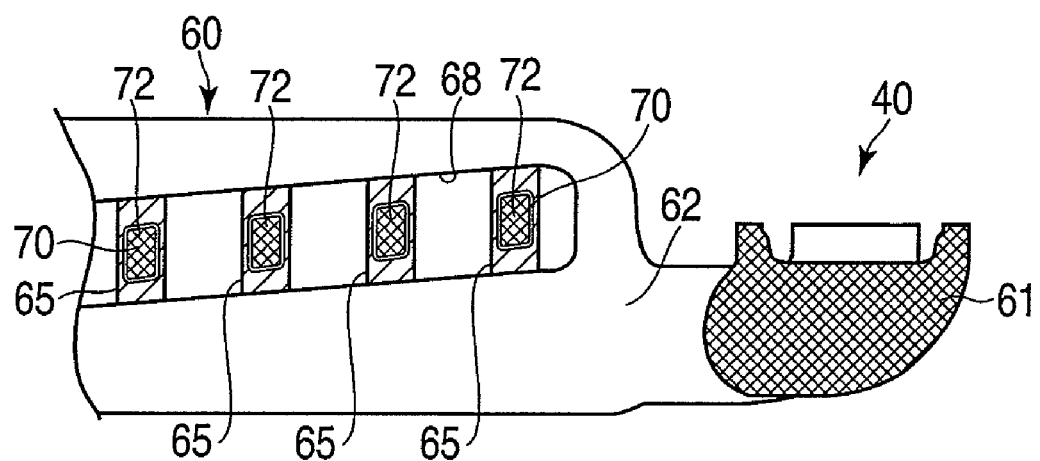
F I G. 13A
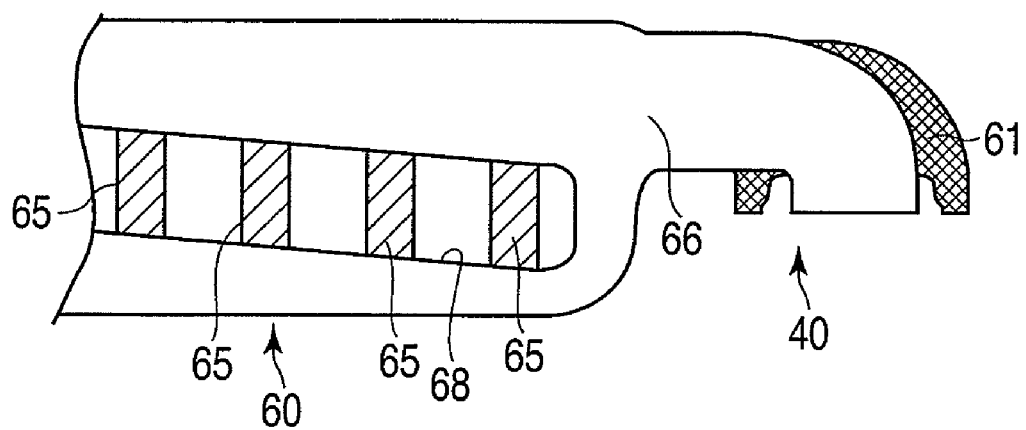
F I G. 13B

HEAD GIMBAL ASSEMBLY AND DISK DRIVE PROVIDED WITH THE SAME

CROSS-REFERENCE TO RELATED APPLICATIONS

This application is based upon and claims the benefit of priority from Japanese Patent Application No. 2009-124418, filed May 22, 2009, the entire contents of which are incorporated herein by reference.

BACKGROUND

1. Field

One embodiment of this invention relates to a head gimbal assembly used in a disk drive comprising a disk as a recording medium and the disk drive provided with the same.

2. Description of the Related Art

In recent years, disk drives, such as magnetic disk drives, optical disc drives, etc., have been widely used as external recording devices of computers or image recording apparatuses.

A disk drive, e.g., a magnetic disk drive, generally comprises a magnetic disk, spindle motor, head actuator, voice coil motor (VCM), circuit board unit, etc. The spindle motor supports and rotates the disk in a case. The head actuator supports a magnetic head. The VCM drives the head actuator.

The head actuator comprises a bearing and arms laminated to and extending from the bearing. The magnetic head is mounted on each arm by means of a suspension.

The circuit board unit integrally comprises a base portion, on which a head IC, connectors, etc., are mounted, and a main flexible printed circuit board (main FPC) extending from the base portion to the vicinity of the bearing. An extended end portion of the main FPC forms a plurality of terminal areas, and a plurality of connection pads are arranged on each terminal area. The terminal areas are attached to the bearing of the head actuator by screws.

A flexure comprising a conductor pattern and terminals is attached to the suspension and each arm of the head actuator. One end of the flexure is connected to the magnetic head, and the other end to its corresponding terminal area of the main FPC. Thus, the head is electrically connected to the circuit board unit through the flexure and main FPC.

Terminal portions at the terminal area of the flexure are known to be formed as flying leads, the obverse and reverse surfaces of which are exposed through insulating layers (e.g., Jpn. Pat. Appln. KOKAI Publications Nos. 2006-49751, and 2008198738), in order to reduce the installation space for the flexure to meet the recent trend toward smaller and thinner magnetic disk drives. The exposed terminal portions are soldered to the connection pads of the main FPC. In order to strengthen the terminal portions to prevent their breaking, tin-alloy layers or lining portions are provided on the upper surface and two opposite side surfaces of each terminal portion.

Electrostatic breakdown of magnetic heads is a major problem in quality of the magnetic disk drives constructed in this manner. In soldering each terminal portion or flying lead to the terminal area of the main FPC or repairing them, for example, a soldering iron is applied to a conductor layer of the terminal portion to melt it. If this is done, however, static electricity may be produced and cause electrostatic breakdown.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 1 is an exemplary perspective view showing an HDD according to a first embodiment of the invention;

FIG. 3 is an exemplary plan view showing a head gimbal assembly of the head stack assembly;

FIG. 5A is an exemplary enlarged plan view showing a terminal area of the flexure;

FIG. 5B is an exemplary enlarged rear view showing the terminal area of the flexure;

FIG. 6 is an exemplary sectional view of the terminal area taken along line VI-VI of FIG. 5;

FIG. 7 is an exemplary sectional view of the terminal area taken along line VII-VII of FIG. 5;

FIG. 8 is an exemplary plan view showing a connection end portion of a main FPC of the HDD;

FIG. 9 is an exemplary plan view showing how the terminal area of the flexure is connected to the connection end portion of the main FPC;

FIG. 10 is an exemplary plan view showing how the terminal area of the flexure is connected to the connection end portion of the main FPC;

FIG. 11A is an exemplary enlarged plan view showing a terminal area of a flexure in an HDD according to a second embodiment of the invention;

FIG. 11B is an exemplary enlarged rear view showing the terminal area of the flexure in the HDD according to the second embodiment;

FIG. 12A is an exemplary enlarged plan view showing a terminal area of a flexure in an HDD according to a third embodiment of the invention;

FIG. 12B is an exemplary enlarged rear view showing the terminal area of the flexure in the HDD according to the third embodiment;

FIG. 13A is an exemplary enlarged plan view showing a terminal area of a flexure in an HDD according to a fourth embodiment of the invention; and FIG. 13B is an exemplary enlarged rear view showing the terminal area of the flexure in the HDD according to the fourth embodiment.

DETAILED DESCRIPTION

Figure 2:
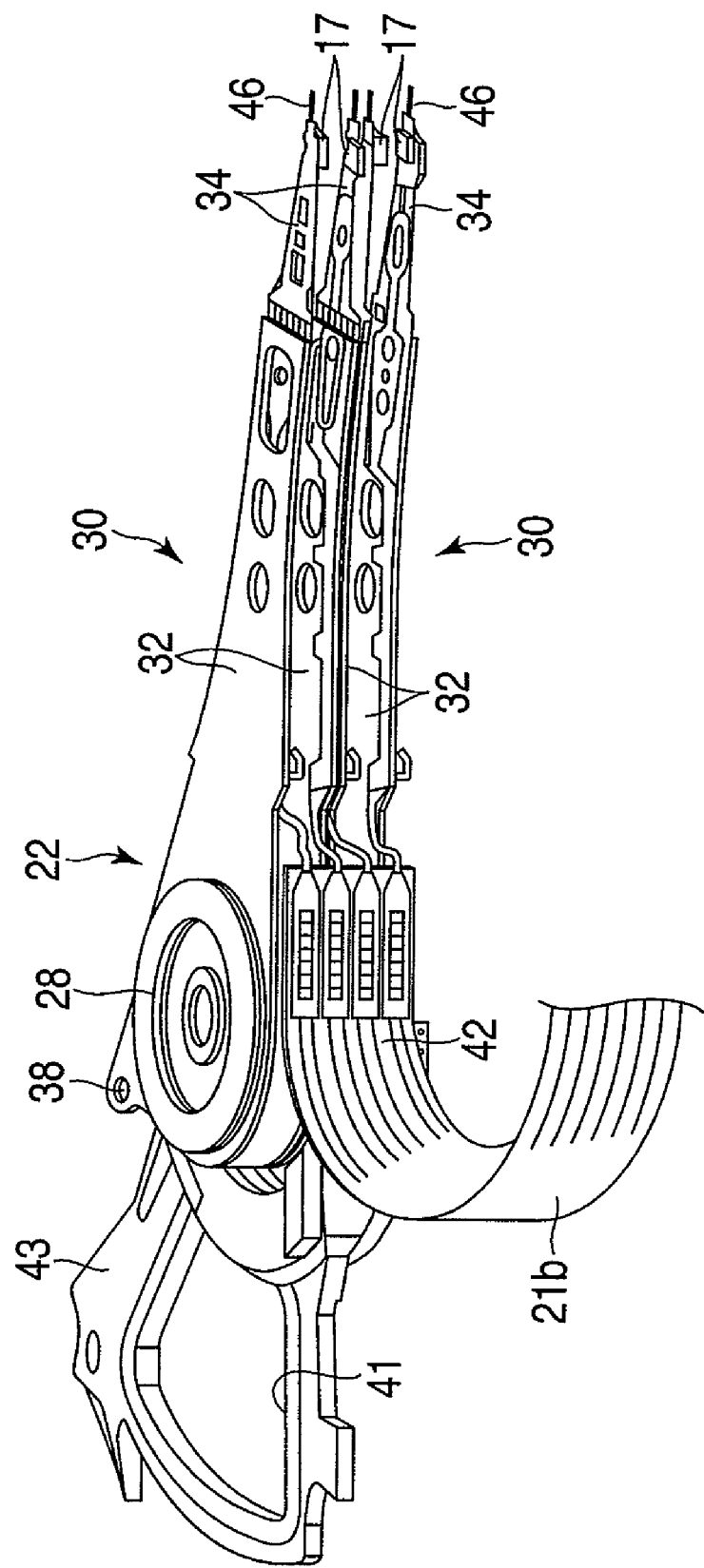
FIG. 2 is an exemplary perspective view showing a head stack assembly of the HDD.

Various embodiments according to the invention will be described hereinafter with reference to the accompanying drawings. In general, according to one embodiment of the invention, a head gimbal assembly comprises: an arm and a suspension extending from the arm; a head supported by the suspension; and a flexure on the arm and the suspension, one end portion of which is electrically connected to the head, and the other end portion of which comprises a terminal area, the flexure comprising a base insulating layer, a conductor pattern formed on the base insulating layer and comprising a plurality of connection terminals, and a cover insulating layer formed on the base insulating layer so as to cover the conductor pattern, the connection terminals at the terminal area being exposed to the inside of an opening formed in the base and cover insulating layers with a protective insulating layer and a thin metal plate overlaid on one surface of each of the connection terminals.

An HDD according to a first embodiment of this invention will now be described in detail with reference to the accompanying drawings. FIG. 1 shows the internal structure of the HDD with its top cover removed. As shown in FIG. 1, the HDD comprises a case 10. The case 10 comprises a base 12 in the form of an open-topped rectangular box and a top cover (not shown), which is fastened to the base by screws so as to close a top opening of the base. The base 12 comprises a rectangular bottom wall 12a, and sidewall 12b, set up along the peripheral edge of the bottom wall.

The case 10 contains two magnetic disks 16 for use as recording media and a spindle motor 18 as a drive unit that supports and rotates the disks. The motor 18 is located on the bottom wall 12a. Each magnetic disk 16 is formed with a diameter of, for example, 65, mm (2.5, inches) and comprises magnetic recording layers on its upper and lower surfaces, individually. The disks 16 are coaxially fitted on a hub (not shown) of the spindle motor 18. Also, the disks 16 are clamped and fixed to the hub by a clamp spring 27. Thus, the disks 16 are supported parallel to the bottom wall 12a, of the base 12. The disks 16 are rotated at a predetermined speed of, for example, 5,400, or 7,200, rpm by the spindle motor 18.

The case 10 further contains a plurality of magnetic heads 17, head stack assembly (HSA) 22, voice coil motor (VCM) 24, ramp load mechanism 25, latch mechanism 26, and board unit 21. The magnetic heads 17 record and reproduce information on and from the magnetic disks 16. The HSA 22 supports the heads for movement relative to the disks 16. The VCM 24 rotates and positions the HSA. The ramp load mechanism 25 holds the magnetic heads 17 in a retracted position at a distance from the magnetic disks 16 when the heads are moved to the outermost peripheries of the disks. The latch mechanism 26 holds the HSA in its retracted position when the HDD is jolted. The board unit 21 comprises a preamplifier and the like.

A printed circuit board (not shown) is attached to the outer surface of the bottom wall 12a, of the base 12 by screws. The circuit board controls the operations of the spindle motor 18, VCM 24, and magnetic heads 17 through the board unit 21. A circulation filter 23 is disposed on the sidewall of the base 12 and located outside the magnetic disks 16. The circulation filter 23 serves to capture dust that is produced in the case as movable parts operate. Further, a breathing filter 50 capable of capturing dust from air that flows into the case 10 is disposed on the sidewall of the base 12.

FIG. 2 is a perspective view showing the HSA 22. As shown in FIGS. 1 and 2, the HSA 22 comprises a rotatable bearing 28 and stack members stacked in layers on the bearing 28. The stack members include four head gimbal assemblies (HGAs) 30, two spacer rings laminated between the HGAs, annular washer, and nut.

The bearing 28 is spaced apart from the center of rotation of the magnetic disks 16 lengthwise relative to the base 12 and located near the outer peripheral edges of the disks 16. The bearing 28 comprises a pivot set up on the bottom wall 12a, of the base 12 and a cylindrical sleeve rotatably supported on the pivot.

As shown in FIGS. 1 to 3, each HGA 30 comprises an arm 32 extending from the bearing 28, a suspension 34 extending from the arm, and the magnetic head 17 supported on an extended end of the suspension by a gimbal portion.

Each arm 32 is a thin flat plate formed by laminating, for example, stainless steel, aluminum, and stainless steel. A circular through-hole 36 is formed in one end or proximal end of the arm 32. Further, the arm 32 comprises a lug protruding from its proximal end and formed with a positioning hole 37. The suspension 34 is formed of an elongated leaf spring, the proximal end of which is fixed to the distal end of the arm 32 by spot welding or adhesive bonding and extends from the arm. The suspension 34 and arm 32 may be integrally formed of the same material.

Each magnetic head 17 comprises a substantially rectangular slider and read/write magnetoresistive (MR) head formed on the slider. The head 17 is fixed to a gimbal portion (not shown) that is formed on the distal end portion of the suspension 34. The head 17 comprises four electrodes (not shown). These electrodes include positive and negative read electrodes and write electrodes. The magnetic head is subjected to a predetermined head load directed toward a surface of each corresponding magnetic disk 16 by the spring force of the suspension 34.

A relay flexible printed circuit board (relay FPC) 40 for use as a flexure is mounted on the arm 32 and suspension 34, and the magnetic head 17 is electrically connected to a main FPC 21b, (mentioned later) through the relay FPC 40.

As shown in FIGS. 1 and 2, the four HGAs 30 and two spacer rings are fitted on the sleeve of the bearing 28, which is passed through the respective through-holes 36 of the arms 32 and through-holes in the spacer rings, and are arranged in layers along the axis of the sleeve. One of the spacer rings on the sleeve is sandwiched between the two adjacent upper arms 32, and the other between the two adjacent lower arms. Further, the annular washer is fitted on the lower end portion of the sleeve of the bearing 28. The arms 32, spacer rings, and washer are sandwiched between a flange and the nut, which is screwed on the lower end of the sleeve of the bearing 28, and are fixedly held on the outer periphery of the sleeve.

A positioning screw 38 is passed through the positioning holes 37 in the four arms 32 and positioning holes in the spacer rings from above and screwed into a positioning hole in the washer. Thus, the four arms 32 and spacer rings are located in their predetermined positions with respect to the circumstance of the bearing 28.

The four arms 32 extend in the same direction from the bearing 28, and the arms 32 and suspensions 34 are pivotable integrally with the bearing 28. The two upper arms are located parallel to each other with a predetermined gap therebetween, and the suspensions 34 and magnetic heads 17 on these arms are opposed to one another. Further, the two lower arms are located parallel to each other with a predetermined gap therebetween, and the suspensions 34 and magnetic heads 17 on these arms are opposed to one another.

A plastic support frame 43 is integrally molded on the one spacer ring. The support frame 43 extends from the bearing 28 so as to be directed opposite from the arms 32. A voice coil 41 that constitutes a part of the VCM 24 is embedded in the frame 43.

With the thus constructed HSA 22 mounted on the base 12, as seen from FIG. 1, the bearing 28 has the lower end portion of its pivot fixed to the base 12 and stands substantially parallel to the spindle of the spindle motor 18. Each magnetic disk 16 is interposed between two adjacent ones of the HGAs 30. When the HDD is powered, the magnetic heads 17 on the arms 32 are opposed individually to the upper and lower surfaces of each disk 16 and hold the disk from both sides. The voice coil 41 fixed to the support frame 43 is located between a pair of yokes 44 fixed to the base 12 and, along with the yokes and a magnet (not shown) fixed to one of the yokes, constitute the VCM 24.

As shown in FIG. 1, the board unit 21 comprises a main body 21a, formed of a flexible printed circuit board and fixed to the bottom wall 12a, of the base 12. Electronic components (not shown), such as a head amplifier, are mounted on the body 21a. Connectors (not shown) for connection with the printed circuit board are mounted on the bottom surface of the main body 21a.

The board unit 21 comprises a main flexible printed circuit board (main FPC) 21b, extending from the main body 21a. An extended end of the main FPC 21b, constitutes a connection end portion 42. As described later, the connection end portion 42 comprises a plurality of connection pads and is fixed in the vicinity of the bearing 28 of the HSA 22. The relay FPC 40 of each HGA 30 is connected mechanically and electrically to the connection end portion 42. Thus, the board unit 21 is electrically connected to the magnetic head 17 through the main and relay FPCs 21b, and 40.

As shown in FIG. 1, the ramp load mechanism 25 comprises a ramp 45 disposed on the bottom wall 12a, of the base 12 and located outside the magnetic disks 16 and tabs 46 (FIGS. 2 and 3) that extend individually from the respective distal ends of the suspensions 34. As the HSA 22 turns around the bearing 28 so that the magnetic heads 17 move to the retracted position outside the disks 16, each tab 46 engages with a ramp surface formed on the ramp 45, and is then pulled up along the slope of the ramp surface. Thereupon, the heads 17 are unloaded from the disks 16 and held in the retracted position.

Figure 4:
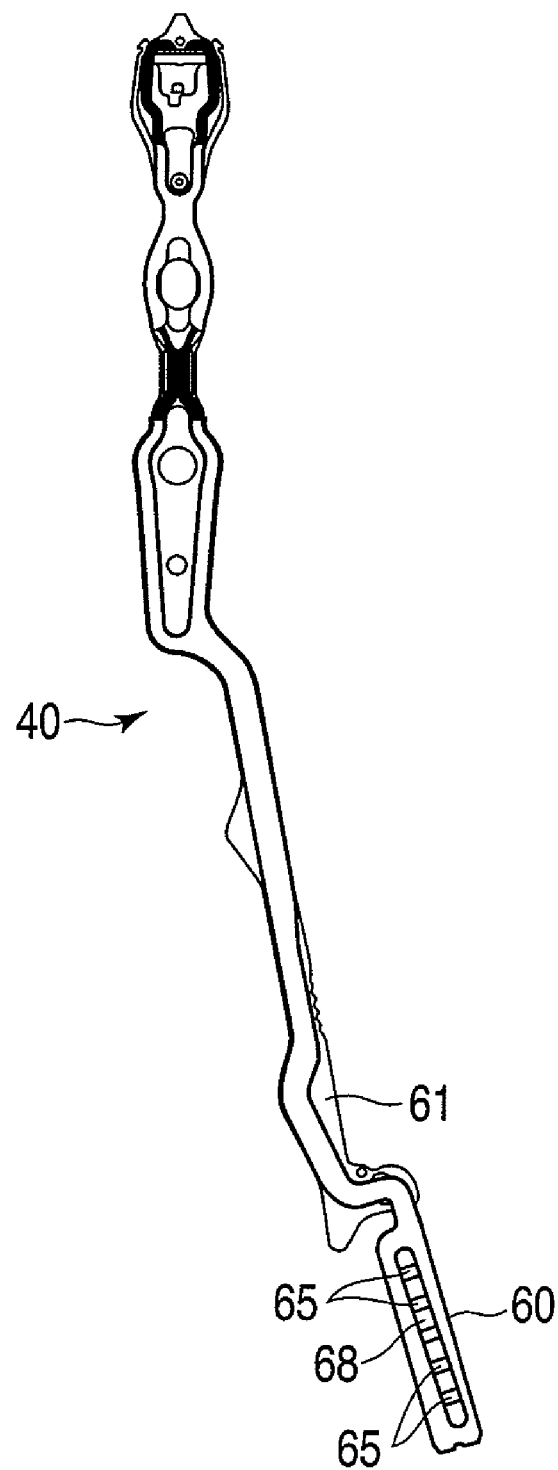
FIG. 4 is an exemplary plan view showing a flexure of the head gimbal assembly.

The HGA 30 and relay FPC 40 will now be described in detail. In the HGA 30, as shown in FIGS. 3 and 4, the magnetic head 17 is electrically connected to the main FPC 21b, through the relay FPC 40. The relay FPC 40 is affixed to the respective inner surfaces of the arm 32 and suspension 34 and extends from the distal end of the suspension to the proximal end portion of the arm. The relay FPC 40 is in the form of an elongated band as a whole and its distal end is electrically connected to the electrodes of the magnetic head 17. The other end portion of the relay FPC 40 extends outward from the proximal end portion of the arm 32 and constitutes a terminal area 60.

FIGS. 5A and 5B are enlarged plan and rear views, respectively, showing the terminal area 60, and FIGS. 6 and 7 are sectional views of the terminal area 60. As shown in FIGS. 3 to 7, the relay FPC 40 comprises a base insulating layer 62, conductor layer (conductor pattern) 64 of, e.g., copper foil formed on the base insulating layer, and cover insulating layer 66 formed on the base insulating layer so as to cover the conductor pattern. A resin material such as polyimide resin is used for the base and cover insulating layers 62 and 66. Further, a thin metal plate (flexure) 61 of, e.g., stainless steel in the form of an elongated band is formed over the entire reverse side of the base insulating layer 62 except the terminal area 60. That part of the relay FPC 40 on the side of the metal plate 61 is affixed to the arm 32 and suspension 34.

The conductor layer 64 constitutes a wiring pattern on the relay FPC 40. One end of the wiring pattern is connected to the electrodes of the magnetic head 17, while the other end forms a plurality (e.g., six) of first connection terminals 65 at the terminal area 60. As shown in FIGS. 5A to 7, the terminal area 60 of the relay FPC 40 has an elongated, substantially rectangular shape extending outward from the arm 32. An elongated rectangular opening 68 is formed in the base and cover insulating layers 62 and 66 and extend substantially longitudinally parallel to the terminal area 60. The first connection terminals 65 of the conductor layer 64 individually extend across the opening 68 and are exposed to the inside of the opening 68.

Each first connection terminal 65 is a band-shaped structure extending widthwise in the opening 68. The first connection terminals 65 are arranged at predetermined intervals lengthwise relative to the opening 68. The surface of each first connection terminal 65 is coated with, for example, gold and nickel plating films. Thus, the first connection terminals 65 constitute so-called flying leads.

A protective insulating layer 70 and thin metal plate 72 are arranged in layers on one surface of each first connection terminal 65 (on the side of the base insulating layer 62 in this case). The protective insulating layer 70, which is slightly narrower than each first connection terminal 65, covers the overall length of the first connection terminal 65. The insulating layer 70 is formed integrally with the base insulating layer 62. The thin metal plate 72 is a band-shaped structure that is slightly narrower than the insulating layer 70 and is overlaid on the insulating layer 70 so as to cover the overall length of the first connection terminal 65. Further, the metal plate 72 extends spanning the opening 68 so that its opposite end portions overlie the base insulating layer 62. The metal plate 72 is formed of the same material as the thin metal plate 61 on the base insulating layer 62. The relay FPC 40 constructed in this manner is formed by, for example, an additive process.

The mechanical strength of the first connection terminals 65 constituting the flying leads can be increased by thus successively overlaying the protective insulating layer 70 and thin metal plate 72 on the one surface of each first connection terminal 65. If static electricity is produced as a soldering iron or the like is brought into contact with the metal plate 72 to solder or repair the first connection terminal 65, as mentioned later, the protective insulating layer 70 can prevent the electricity from flowing into the conductor pattern via the first connection terminal 65, thereby preventing electrostatic breakdown of the magnetic head 17.

As shown in FIG. 8, on the other hand, the connection end portion 42 of the main FPC 21b, to which the terminal area 60 of the relay FPC 40 is connected comprises a base insulating layer 80, conductor layer of, for example, copper formed on the base insulating layer, and cover insulating layer 82. A substantially rectangular reinforcement plate 81 of stainless steel or aluminum is affixed to the reverse side of the base insulating layer. A resin material such as polyimide resin is used for the base and cover insulating layers 80 and 82.

The conductor layer constitutes a wiring pattern (not shown) on the relay FPC 40. One end of this wiring pattern is connected to the main body 21a, of the board unit 21, while the other end forms a plurality of second connection terminals 84 at the connection end portion 42. A plurality (four in this case) of elongated rectangular openings 83 are formed in the cover insulating layer 82 at the connection end portion 42 and individually extend substantially longitudinally parallel to the connection end portion 42. The second connection terminals 84 of the conductor layer individually extend across the openings 83 and are exposed to the inside of the openings 83.

Each second connection terminal 84 extends widthwise in each corresponding opening 83. The second connection terminals 84 (e.g., six) are arranged at predetermined intervals lengthwise relative to the openings 83. A pre-solder 86 is formed on a surface of each second connection terminal 84 and constitutes a solder bump.

When the reinforcement plate 81 is opposed to the HSA 22, the connection end portion 42 of the main FPC 21b, is fixed to the spacer rings of the HSA 22 by screws or the like.

FIG. 9 shows the state after the relay FPC 40 of the HGA 30 is soldered to the connection end portion 42 of the main FPC 21b. The terminal area 60 of the relay FPC 40 is bent substantially at right angles to the other part and overlaid on the connection end portion 42 of the main FPC 21b. Each first connection terminal 65 of the terminal area 60 is opposed to its corresponding second connection terminal 84 of the main FPC 21b. When this is done, the first connection terminal 65 is located so that its exposed surface opposite from that surface on which the protective insulating layer 70 and thin metal plate 72 are arranged is opposed to the second connection terminal 84.

If the pre-solder 86 on each second connection terminal 84 is melted by, for example, applying the soldering iron to it from above the thin metal plate 72 in this state, the first and second connection terminals 65 and 84 are soldered to each other. Each first connection terminal 65 is narrower than each second connection terminal 84. The first connection terminal 65 is opposed to the inside of a contour of the second connection terminal 84 when these terminals are soldered together. When this is done, the pre-solder 86 on each second connection terminal 84 covers the upper and lower surfaces of each first connection terminal 65, which comprises the thin metal plate 72, protective insulating layer 70, and conductor layer 64, whereby a strongly bonded state is formed. Thereupon, electrical connection from the magnetic heads 17 to a head IC and the like on the board unit 21 is established. Since each thin metal plate 72 for reinforcement and pre-solder 86 are electrically connected to each other, the metal plates 72 arranged individually on the first connection terminals 65 need to be electrically independent of one another.

If the pre-solder 86 on each second connection terminal 84 is small, it may only partially cover the first connection terminal 65 and thin metal plate 72, as shown in FIG. 10. However, there are no problems on the electrical connection between the first and second connection terminals and the bond strength of the solder bead.

If the HDD constructed in this manner is powered, the magnetic disks 16 rotate at high speed. When the voice coil 41 is energized, the HSA 22 pivots around the bearing 28, whereupon the magnetic heads 17 are moved toward and positioned over desired tracks of the disks 16. The heads 17 perform information processing on the disks 16, that is, write and read information to and from the disks.

In each HGA 30 of the HDD described above, the one surface side of each first connection terminal 65 constituting the flying lead of the relay FPC 40 is reinforced by the protective insulating layer 70 and thin metal plate 72. In soldering or repairing the terminal 65, therefore, the flying lead can be prevented from being broken. Since the first connection terminals 65 can be assured of sufficient mechanical strength by reinforcement, moreover, they can be made so narrow that the increase in the number of terminals can be overcome without narrowing the intervals between them.

Thus, according to the embodiment described above, the terminal area 60 of the relay FPC 40 comprises the six first connection terminals 65, and the connection end portion 42 of the main FPC 21b, comprises the six corresponding second connection terminals 84. New technologies, such as assisted recording, dual-stage actuators, etc., will possibly be introduced in the future in order to provide magnetic disk drives with higher performance. If these technologies are used, however, the number of first and second connection terminals needs to be increased. When this is done, the sizes of the terminal area 60 of the relay FPC 40 and the connection end portion 42 of the main FPC 21b, are not changed, so that the intervals between the first and second connection terminals 65 and 84 and they need to be narrowed.

If the intervals between the first and second connection terminals are reduced, the adjacent terminals may be short-circuited. The short-circuiting naturally results in a malfunction and also causes an overcurrent to flow through electromagnetic transducers of the magnetic heads, thereby breaking the transducers. Preferably, therefore, the intervals between the first and second connection terminals 65 and 84 should not be reduced.

If the first connection terminals 65 are narrowed, moreover, they may be broken. As in the present embodiment, therefore, the mechanical strength of the first connection terminals 65 can be increased by reinforcing each first connection terminal 65 with the protective insulating layer 70 and thin metal plate 72. Consequently, the first connection terminals can be narrowed.

Thus, breakage and short-circuiting of the flying leads can be prevented to ensure high reliability of the HGAs and magnetic disk drive by reinforcing each first connection terminal constituting each flying lead with the thin metal plate and protective insulating layer. Since the first connection terminals can be assured of sufficient mechanical strength by the reinforcement, moreover, they can be narrowed so that the intervals between them can be reduced. Thus, the increase in the number of terminals, which is caused by the introduction of new technologies, such as assisted recording, dual-stage actuators, etc., can be overcome.

Furthermore, the protective insulating layer 70 is disposed between the first connection terminal 65 and thin metal plate 72. If static electricity is produced as the soldering iron or the like is brought into contact with the thin metal plate 72 to solder or repair the first connection terminal, the protective insulating layer 70 can prevent the electricity from flowing into the conductor pattern via the first connection terminal 65. Accordingly, electrostatic breakdown of each magnetic head 17 can securely be prevented, so that the reliability of each HGA and HDD can be improved. Thus, a high-performance magnetic disk drive can be provided.

The following is a description of another embodiment of the invention.

FIGS. 11A and 11B are plan and rear views, respectively, showing a terminal area 60 of a relay FPC 40 of an HGA in an HDD according to a second embodiment.

According to the second embodiment, as shown in FIGS. 11A and 11B, each of first connection terminals 65 of the relay FPC 40 is a band-shaped structure extending widthwise in an opening 68. The first connection terminals 65 are arranged at predetermined intervals lengthwise relative to the opening 68. The surface of each first connection terminal 65 is coated with, for example, gold and nickel plating films. Thus, the first connection terminals 65 constitute so-called flying leads.

A protective insulating layer 70 and thin metal plate 72 are arranged in layers on one surface of each first connection terminal 65 (on the side of a base insulating layer 62 in this case). In the present embodiment, the protective insulating layer 70 and thin metal plate 72 are located in two positions so as to overlie the longitudinally opposite end portions of each first connection terminal 65. The longitudinal central part of each first connection terminal 65 is formed of a conductor layer only.

Each protective insulating layer 70, which is slightly narrower than each first connection terminal 65, is formed integrally with the base insulating layer 62. Each thin metal plate 72 is a band-shaped structure that is slightly narrower than the protective insulating layer 70 and is overlaid on the protective insulating layer 70 and base insulating layer 62. Further, the metal plate 72 extends over one side edge of the opening 68. The metal plate 72 is formed of the same material as a thin metal plate 61 on the base insulating layer 62.

The mechanical strength of the first connection terminals 65 constituting the flying leads can be increased by thus successively overlaying the protective insulating layer 70 and thin metal plate 72 on the one surface of each first connection terminal 65. If static electricity is produced as the soldering iron or the like is brought into contact with the metal plate 72 to solder or repair the first connection terminal 65, as mentioned later, the protective insulating layer 70 can prevent the electricity from flowing into the conductor pattern via the first connection terminal 65, thereby preventing electrostatic breakdown of the magnetic head 17. According to the present embodiment, moreover, a pre-solder 86 on each second connection terminal of a main FPC can cover the upper and lower surfaces of even the central part of each first connection terminal 65 formed of the conductor layer only, so that a more strongly bonded state can be obtained.

FIGS. 12A and 12B are plan and rear views, respectively, showing a terminal area 60 of a relay FPC 40 of an HGA in an HDD according to a third embodiment.

According to the third embodiment, which resembles the first embodiment, as shown in FIGS. 12A and 12B, each of first connection terminals 65 of the relay FPC 40 is a band-shaped structure extending widthwise in an opening 68. A protective insulating layer 70 and thin metal plate 72 are arranged in layers on one surface of each first connection terminal 65 (on the side of a base insulating layer 62 in this case). The protective insulating layer 70, which is slightly narrower than each first connection terminal 65, covers the overall length of the first connection terminal 65. The insulating layer 70 is formed integrally with the base insulating layer 62. The thin metal plate 72 is a band-shaped structure that is slightly narrower than the insulating layer 70 and is overlaid on the insulating layer 70 so as to cover the overall length of the first connection terminal 65. Further, the metal plate 72 extends spanning the opening 68 so that its opposite end portions overlie the base insulating layer 62.

At the terminal area 60 of the relay FPC 40 according to the third embodiment, the thin metal plate 61 covers the entire base insulating layer 62. The thin metal plates 72 for reinforcement arranged individually on the first connection terminals 65 are formed separately from the thin metal plate 61 that covers the entire terminal area 60 so as to be electrically independent of one another, as mentioned before. The thin metal plate 61 on the base insulating layer 62 and the thin metal plates 72 for reinforcement are formed of the same material.

According to this arrangement, the same function and effect as those of the first embodiment can be obtained, and the impedance of a wiring pattern on the terminal area 60 can be reduced. If optical soldering using a halogen lamp is performed, the thin metal plate 61 can disperse heat, thereby preventing the protective insulating layer 70 from burning. Further, a blind plate and pressing jig used in the optical soldering can be set stably on the terminal area 60 of the relay FPC 40.

FIGS. 13A and 13B are plan and rear views, respectively, showing a terminal area 60 of a relay FPC 40 of an HGA in an HDD according to a fourth embodiment.

According to the fourth embodiment, as shown in FIGS. 13A and 13B, each of first connection terminals 65 of the relay FPC 40 is a band-shaped structure extending widthwise in an opening 68. A protective insulating layer 70 and thin metal plate 72 are arranged in layers on the central part of one surface of each first connection terminal 65 (on the side of a base insulating layer 62 in this case). The protective insulating layer 70 is slightly narrower and shorter than each first connection terminal 65. The insulating layer 70 is formed of the same material as the base insulating layer 62 and is spaced apart from the base insulating layer. The thin metal plate 72, which is slightly narrower and shorter than the protective insulating layer 70, is overlaid on the insulating layer 70. The metal plate 72 is formed of the same material as a thin metal plate 61. Further, a plurality of metal plates 72 for reinforcement and the metal plate 61 for covering are electrically independent of one another.

In soldering the terminal area 60 of the relay FPC 40 and the connection terminals of a main FPC 21b, according to the fourth embodiment, a bonding tool is brought into contact with the thin metal plate 72 on the central part of each first connection terminal 65, whereupon heat for soldering is transferred to a solder bead 86 on each of second connection terminals 84 through a conductor layer. As this is done, the soldering can be performed with the bonding tool not in contact with the conductor layer of each first connection terminal 65, so that magnetic heads can be prevented from being damaged by static electricity. Further, the fourth embodiment can provide the same function and effect as those of the first embodiment.

In the second to fourth embodiments described herein, other configurations of the HDD and each HGA are the same as those of the first embodiment, so that like reference numbers refer to like portions of the embodiments, and a detailed description of those portions is omitted.

While certain embodiments of the invention have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

For example, the magnetic disk size is not limited to 2.5, inches, and magnetic disks of other sizes may be used. The number of magnetic disks is not limited to two, and may alternatively be one or three or more. Also, the number of HGAs may be varied depending on the number of installable magnetic disks. The material of the relay and main FPCs is not limited to the embodiments described herein, and may be selected as required.

What is claimed is:

1. A head gimbal assembly comprising:
   an arm and a suspension extending from the arm;
   a head supported by the suspension; and
   a flexure on the arm and the suspension, comprising a first end portion electrically connected to the head, and a second end portion comprising a terminal area,
   the flexure comprising a base insulating layer, a conductor pattern on the base insulating layer and comprising a plurality of connection terminals, and a cover insulating layer on the base insulating layer configured to cover the conductor pattern,
   the connection terminals at the terminal area being exposed to the inside of an opening in the base and cover insulating layers and comprising a protective insulating layer and a thin metal plate on one surface of each of the connection terminals.

2. The head gimbal assembly of claim 1, wherein the connection terminals individually extend across the opening and are aligned with gaps therebetween.

3. The head gimbal assembly of claim 2, wherein the protective insulating layer is on the connection terminal throughout a length of the connection terminal, and the thin metal plate is overlapping the protective insulating layer and spanning the opening.

4. The head gimbal assembly of claim 2, wherein the protective insulating layer and the thin metal plate are in layers in two end positions of the connection terminal opposite to each other in a longitudinal direction.

5. The head gimbal assembly of claim 2, wherein the protective insulating layer and the thin metal plate are in layers on a longitudinal central portion of the connection terminal and located at a predetermined distance from the base and cover insulating layers.

6. The head gimbal assembly of claim 3, wherein the protective insulating layer is formed integrally with the base insulating layer.

7. The head gimbal assembly of claim 1, wherein a plurality of the thin metal plates aligned individually on the connection terminals are electrically independent from each another.

8. The head gimbal assembly of claim 1, wherein a width of the protective insulating layer is smaller than a width of the connection terminal, and a width of the thin metal plate is smaller than a width of the protective insulating layer.

9. The head gimbal assembly of claim 1, wherein the terminal area comprises a thin metal covering plate configured to cover the entire base insulating layer, the metal covering plate being electrically independent from the thin metal plates on the connection terminals.

10. A disk drive comprising:
- a disk recording medium;
- a drive motor configured to support the recording medium and to rotate the recording medium;
- a head configured to record information on the recording medium and to reproduce information from the recording medium;
- a head stack assembly configured to support the head allowing movement relative to the recording medium; and
- a board unit comprising a main flexible circuit board, which comprises a connection end portion connected to the head stack assembly;

the head stack assembly comprising a bearing and a plurality of head gimbal assemblies supported by the bearing, the head gimbal assemblies each comprising an arm, a suspension extending from the arm and supporting the head, and a flexure on the arm and the suspension, a first end portion of the flexure is electrically connected to the head, and a second end portion of the flexure comprises a terminal area connected to the connection end portion of the main flexible board, the flexure comprising a base insulating layer, a conductor pattern on the base insulating layer and comprising a plurality of connection terminals, and a cover insulating layer on the base insulating layer configured to cover the conductor pattern, the connection terminals at the terminal area being exposed to the inside of an opening in the base and cover insulating layers and comprising a protective insulating layer and a thin metal plate on one surface of each of the connection terminals.

11. The disk drive of claim 10, wherein the connection terminals individually extend across the opening and are aligned with gaps therebetween.

12. The disk drive of claim 11, wherein the protective insulating layer is on the connection terminal throughout the length of the connection terminal, and the thin metal plate is overlapping the protective insulating layer and spanning the opening.

13. The disk drive of claim 11, wherein the protective insulating layer and the thin metal plate are in layers in two end positions of the connection terminal opposite to each other in a longitudinal direction.

14. The disk drive of claim 11, wherein the protective insulating layer and the thin metal plate are in layers on a longitudinal central portion of the connection terminal and located at a predetermined distance from the base and cover insulating layers.

* * * * *